(12) United States Patent
Hirano et al.

(10) Patent No.: US 10,007,181 B2
(45) Date of Patent: Jun. 26, 2018

(54) CHEMICALLY AMPLIFIED POSITIVE RESIST DRY FILM, DRY FILM LAMINATE AND METHOD OF PREPARING LAMINATE

(71) Applicant: SHIN-ETSU CHEMICAL CO., LTD., Tokyo (JP)

(72) Inventors: Yoshinori Hirano, Annaka (JP); Satoshi Asai, Annaka (JP); Hideyoshi Yanagisawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 14/841,824

(22) Filed: Sep. 1, 2015

(65) Prior Publication Data

US 2016/0070170 A1    Mar. 10, 2016

(30) Foreign Application Priority Data

Sep. 8, 2014    (JP) ................. 2014-182423

(51) Int. Cl.
*G03F 7/039* (2006.01)
*G03F 7/004* (2006.01)
*G03F 7/11* (2006.01)
*G03F 7/16* (2006.01)

(52) U.S. Cl.
CPC .......... *G03F 7/0397* (2013.01); *G03F 7/0045* (2013.01); *G03F 7/0048* (2013.01); *G03F 7/0392* (2013.01); *G03F 7/11* (2013.01); *G03F 7/168* (2013.01)

(58) Field of Classification Search
None
See application file for complete search history.

(56) References Cited

U.S. PATENT DOCUMENTS

| | | | | |
|---|---|---|---|---|
| 5,759,739 | A | * | 6/1998 | Takemura ............... G03F 7/039 430/270.1 |
| 6,319,650 | B1 | | 11/2001 | Gelorme et al. |
| 6,680,440 | B1 | * | 1/2004 | Russell ................. G03F 7/0385 174/260 |
| 8,729,148 | B2 | | 5/2014 | Asai et al. |
| 2002/0111459 | A1 | | 8/2002 | Takeda et al. |
| 2003/0008238 | A1 | | 1/2003 | Goldfarb |
| 2003/0013832 | A1 | | 1/2003 | Watanabe et al. |
| 2003/0091926 | A1 | * | 5/2003 | Shelnut .................. G03F 7/027 430/258 |
| 2003/0118934 | A1 | | 6/2003 | Takeda et al. |
| 2003/0190818 | A1 | | 10/2003 | Carbonell et al. |
| 2009/0068594 | A1 | | 3/2009 | Shimbori |
| 2010/0047715 | A1 | * | 2/2010 | Washio ................. G03F 7/0045 430/286.1 |
| 2010/0143830 | A1 | | 6/2010 | Ohashi et al. |
| 2011/0300482 | A1 | * | 12/2011 | Suzuki .................. C07C 381/12 430/270.1 |

FOREIGN PATENT DOCUMENTS

| | | |
|---|---|---|
| EP | 0 838 727 A1 | 4/1998 |
| EP | 2 239 631 A1 | 10/2010 |
| EP | 2 364 847 A1 | 9/2011 |
| JP | 6-35190 A | 2/1994 |
| JP | 11-236416 A | 8/1999 |
| JP | 2002-234910 A | 8/2002 |
| JP | 2003-131384 A | 5/2003 |
| JP | 2006-309051 A | 11/2006 |
| JP | 2006-350293 A | 12/2006 |
| JP | 2007-272087 A | 10/2007 |
| JP | 2011-145664 A | 7/2011 |
| WO | 2007/069585 A1 | 6/2007 |
| WO | 2014/065220 A1 | 5/2014 |

OTHER PUBLICATIONS

European Search Report dated Dec. 23, 2015, issued in counterpart European Application No. 15 18 2701. (12 pages).
Moon-Gyu Sung et al., "Soft Bake Effect in 193 nm Chemically Amplified Resist", Proceedings of SPIE, S P I E—International Society for Optical Engineering, US, vol. 3999, Jan. 2000, pp. 1062-1069, XP009187712.
Office Action dated May 1, 2018, issued in counterpart Japanese Application No. 2015-160780, with English machine translation. (16 pages).

* cited by examiner

*Primary Examiner* — Sin J Lee
(74) *Attorney, Agent, or Firm* — Westerman, Hattori, Daniels & Adrian, LLP

(57) ABSTRACT

A chemically amplified positive resist dry film to be formed on a support film contains 5-40 wt % of a component having a boiling point of 55-250° C. under atmospheric pressure. The resist dry film having flexibility and dimensional stability can be prepared through simple steps. The resist dry film can be efficiently and briefly laid on an article and processed to form a pattern.

14 Claims, No Drawings

CHEMICALLY AMPLIFIED POSITIVE RESIST DRY FILM, DRY FILM LAMINATE AND METHOD OF PREPARING LAMINATE

CROSS-REFERENCE TO RELATED APPLICATION

This non-provisional application claims priority under 35 U.S.C. § 119(a) on Patent Application No. 2014-182423 filed in Japan on Sep. 8, 2014, the entire contents of which are hereby incorporated by reference.

TECHNICAL FIELD

This invention relates to a chemically amplified positive resist dry film, a dry film laminate and a method for preparing the laminate.

BACKGROUND ART

Recently, multi-pin thin-layer mount packages are used to comply with electronic devices of high integration density. Needed for such multi-pin structures is a technique for forming bump electrodes with a height of 10 to 100 μm or more as connecting terminals. When electrodes are formed by the plating method, chemically amplified positive photoresist materials are often used because a high sensitivity and high resolution can be achieved in a relatively simple way, and the photoresist film can be readily stripped after plating. When a film of photoresist material is formed, in most cases, spin coating is used to coat the photoresist material onto a substrate. Under certain coating conditions, an excess of the photoresist material is dried, before suction into the drain of the coater cup, to form floss known as "cotton candy" that floats above the coater cup, causing contamination to the surrounding and substrate.

To avoid such a phenomenon, another means of film formation is desirable. As the rewiring material used in the later step of the semiconductor manufacturing process, for example, a dry film of negative resist composition comprising a polymer of silicone structure is used as disclosed in Patent Document 1. Nevertheless, regarding the chemically amplified positive resist composition based on a phenol-containing resin as an effective component, only limited examples are found in Patent Documents 2 and 3. Specifically, Patent Document 2 refers to a limitative composition comprising a heat-polymerizable compound and a heat-polymerization initiator. In Patent Document 3, a thermoplastic resin layer must be formed as an intermediate layer between a chemically amplified positive resist dry film layer and a support film. The dry film layer has a thickness in the range of 0.5 to 10 μm. Thus the material finds only limited applications.

This is partly because polymers used in chemically amplified positive resist compositions are generally phenol-containing resins, specifically polymers having monomeric units of p-hydroxystyrene. Since polymers having a high content of phenol units are hard and brittle, films thereof are less flexible, suffering from the problem of cracking. To avoid cracking, Patent Documents 2 and 3 use a heat-polymerizable compound having two or more ethylenically unsaturated bonds in the molecule or a thermoplastic resin layer to impart flexibility. With these materials, however, limits are imposed on the characteristics that the material should exhibit in itself.

It has long been waited to have a chemically amplified positive resist dry film which is based on a combination of essential components: (1) a polymer which turns soluble in alkaline aqueous solution under the action of acid and (2) a photoacid generator capable of generating an acid in response to radiation or actinic light and contains optional additives, as in conventional liquid chemically amplified positive resist compositions, because the dry film can find a wide variety of use without limitation.

CITATION LIST

Patent Document 1: JP-A 2011-145664 (U.S. Pat. No. 8,729,148, EP 2364847)
Patent Document 2: JP-A 2006-350293
Patent Document 3: WO 2014/065220

DISCLOSURE OF INVENTION

An object of the invention is to provide a chemically amplified positive resist dry film having flexibility, dimensional stability and crack resistance, a dry film laminate, and a method for preparing the laminate.

The inventors have found that better results are obtained when the chemically amplified positive resist dry film contains 5 to 40% by weight of a component having a boiling point of 55 to 250° C. under atmospheric pressure.

In one aspect, the invention provides a chemically amplified positive resist dry film to be formed on a support film, containing 5 to 40% by weight of a component having a boiling point of 55 to 250° C. under atmospheric pressure.

Preferably the resist dry film contains 5 to 40% by weight of a component which volatilizes during heat treatment at 150° C. for 1 hour.

The component having a boiling point of 55 to 250° C. under atmospheric pressure is preferably an organic solvent.

In a preferred embodiment, the resist dry film comprises (1) a polymer which turns soluble in alkaline aqueous solution under the action of acid and (2) a photoacid generator capable of generating an acid in response to radiation or actinic light, so that the resist dry film may dissolve in alkaline aqueous solution upon receipt of radiation or actinic light.

Typically, the polymer is a phenol-containing resin. Preferably, the phenol-containing resin comprises recurring units of hydroxystyrene structure.

Also contemplated herein is a dry film laminate comprising the chemically amplified positive resist film defined above, a support film laminated on one surface of the dry film, and a protective film laminated on another surface of the dry film, the protective film being stripped from the dry film by a stripping force of 1 to 500 gf/24 mm.

In another aspect, the invention provides a method for preparing a dry film laminate, comprising the steps of:
(i) coating a chemically amplified positive resist composition solution on a support film, and
(ii) heating the resist composition solution to remove an organic solvent and a volatile component therefrom and to form a chemically amplified positive resist dry film, the resist dry film containing 5 to 40% by weight of a component having a boiling point of 55 to 250° C. under atmospheric pressure.

In a further aspect, the invention provides a method for preparing a resist dry film laminate, comprising the steps of:
(iii) continuously coating a chemically amplified positive resist composition solution onto a support film at a rate of 0.05 to 1,000 m/min,
(iv) heating the resist composition solution to remove an organic solvent and a volatile component therefrom to form a dry film/support film laminate, the dry film containing 5 to 40% by weight of a component having a boiling point of 55 to 250° C. under atmospheric pressure, and (v) continuously winding the laminate into a roll form.

Preferably, the method further comprises laminating a protective film on the dry film after step (ii) or (iv), wherein a stripping force of stripping the protective film from the dry film is 1 to 500 gf/24 mm.

ADVANTAGEOUS EFFECTS OF INVENTION

A chemically amplified positive resist dry film having flexibility and dimensional stability can be prepared through simple steps. The resist dry film can be efficiently and briefly laid on an article and processed to form a pattern.

PREFERRED EMBODIMENTS

The resist dry film of the invention is a film of non-liquid type which can be used for the protection of semiconductor substrates such as circuit substrates, printed wiring boards, TSV wafers, and semiconductor packages. The resist dry film is typically formed on a support film to construct a laminate and further overlaid with a protective film which is strippable.

The chemically amplified positive resist dry film is preferably formed from a chemically amplified positive resist composition comprising (1) a polymer which turns soluble in alkaline aqueous solution under the action of acid and (2) a photoacid generator capable of generating an acid in response to radiation or actinic light.

Component (1) of the resist dry film, the polymer which turns soluble in alkaline aqueous solution under the action of acid is first described. This polymer is not particularly limited as long as it has an acid-labile dissolution inhibiting group which has been modified so as to inhibit dissolution in alkaline aqueous solution, but is converted to a hydroxyl and/or carboxyl group under the action of acid. Polymers containing a phenol structure are preferred. Acrylic acid or acrylic ester polymers are also preferred. Examples of the polymer include novolak resins in which hydrogen of some hydroxyl groups is protected with an acid-labile dissolution inhibiting group, as disclosed in JP-A 2006-309051 or US 2009/068594 (A1). More preferred are a homopolymer of hydroxystyrene and a copolymer of hydroxystyrene with a vinyl monomer having a carboxyl group. Examples of these polymers include hydroxystyrene polymers in which hydrogen of some hydroxyl groups is protected with a $C_1$-$C_6$ alkyl, acetal, or tert-butoxycarbonyl group. Typical examples of these polymers are described in JP-A H11-236416 or US 2003/013832 (A1). Also useful are copolymers of hydroxystyrene with carboxyl-bearing monomers such as (meth)acrylic acid, (meth)acrylates, and maleic acid, in which hydrogen of some hydroxyl and carboxyl groups is protected with an acid-labile dissolution inhibiting group. Typical examples of these copolymers are described in JP-A 2002-234910 or US 2002/111459 (A1) and JP-A 2003-131384 or US 2003/118934 (A1). The above-exemplified polymers are not exhaustive. According to the invention, films are formed from these resins whereby flexibility is improved.

The polymer or base resin should preferably have a weight average molecular weight (Mw) of 1,000 to 500,000, more preferably 2,000 to 50,000, and a dispersity (Mw/Mn) of 1.0 to 4.0, more preferably 1.0 to 2.0, as measured by gel permeation chromatography (GPC) versus polystyrene standards.

The polymer or base resin can be prepared from a phenol monomer, a monomer having an ethylenically unsaturated double bond, a styrene monomer or an acrylate monomer.

A preferred polymer is one in which a part of hydrogen atoms of phenolic hydroxyl groups of a polymer having recurring units of the general formula (1) are replaced by at least one acid labile group. Especially, a polymer having a weight average molecular weight of 1,000 to 500,000 in which hydrogen atoms of phenolic hydroxyl groups of polyhydroxystyrene or its derivative are partly substituted by at least one acid labile group is preferably used.

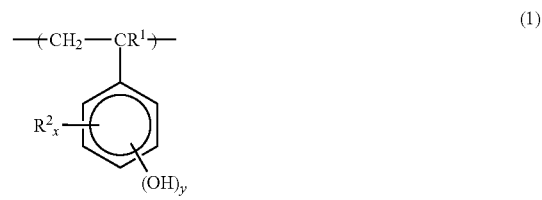

(1)

Herein $R^1$ is hydrogen atom or methyl group, $R^2$ is a linear, branched or cyclic alkyl group having 1 to 6 carbon atoms, x is 0 or a positive integer, y is a positive integer, and x+y is a number satisfying x+y≤5.

The acid labile group is selected from a variety of such groups, preferably from groups represented by the following general formula (2), groups represented by the following general formula (3), tert-alkyl groups, trialkylsilyl groups, and ketoalkyl groups.

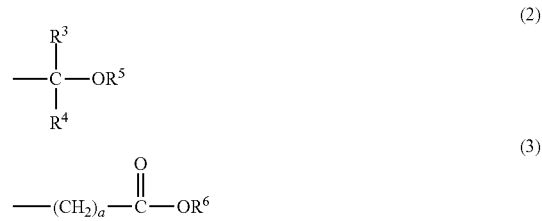

In formula (2), $R^3$ and $R^4$ are each independently hydrogen atom or a linear or branched alkyl group having 1 to 6 carbon atoms, $R^5$ is a linear, branched or cyclic alkyl group having 1 to 10 carbon atoms. Alternatively, a pair of $R^3$ and $R^4$, $R^3$ and $R^5$ or $R^4$ and $R^5$ may bond together to form a ring with the carbon atom or the carbon and oxygen atoms to which they are attached, each participant of $R^3$, $R^4$ and $R^5$ is a straight or branched alkylene group having 1 to 6 carbon atoms. Examples of the group of formula (2) include linear or branched acetal groups such as 1-ethoxyethyl group, 1-n-propoxyethyl group, 1-isopropoxyethyl group, 1-n-butoxyethyl group, 1-isobutoxyethyl group, 1-sec-butoxyethyl group, 1-tert-butoxyethyl group, 1-tert-amyloxyethyl group, 1-ethoxy-n-propyl group, and 1-cyclohexyloxyethyl group, and cyclic acetal groups such as tetrahydrofuranyl group. Among them, 1-ethoxyethyl group and 1-ethoxy-n-propyl group are preferred.

In formula (3), $R^6$ is a tertiary alkyl group having 4 to 12, preferably 4 to 8, more preferably 4 to 6 carbon atoms, and "a" is an integer of 0 to 6.

Examples of the group of formula (3) include tert-butoxycarbonyl group, tert-butoxycarbonylmethyl group, tert-amyloxycarbonyl group and tert-amyloxycarbonylmethyl group.

Examples of the tert-alkyl group include tert-butyl group, tert-amyl group, and 1-methylcyclohexyl group.

Examples of the trialkylsilyl group include those in which each alkyl moiety has 1 to 6 carbon atoms such as trimethylsilyl group, triethylsilyl group and dimethyl-tert-butylsilyl group.

Examples of the ketoalkyl group include 3-oxocyclohexyl group and the following groups:

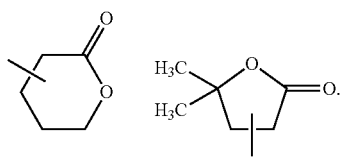

As the polymer or base resin, an acrylic resin of the following general formula (4) which has an acid labile group at the ester side chain and is derived from a (meth)acrylic acid and ester:

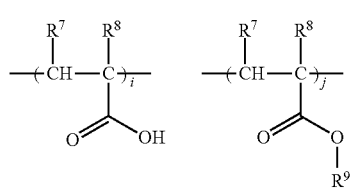

(4)

Herein, $R^7$ is hydrogen atom or methyl group, $R^8$ is hydrogen atom, methyl group, alkoxycarbonyl group, cyano group, halogen atom, or trifluoromethyl group, $R^9$ is a substituted or unsubstituted alkyl or cycloalkyl group having 4 to 30 carbon atoms, or lactone group, i is 0 or a positive number, j is a positive number, and i+j=1.

More preferably, the following polymer having recurring units of the general formula (5) and a weight average molecular weight of 1,000 to 500,000 is desirably used.

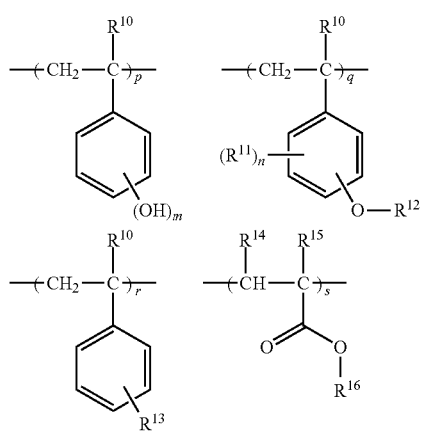

(5)

Herein $R^{10}$ is hydrogen, hydroxyl, straight $C_1$-$C_6$ alkyl, branched $C_3$-$C_6$ alkyl, halogen or trifluoromethyl, $R^{11}$ is hydrogen, hydroxyl, halogen or trifluoromethyl, $R^{12}$ is $C_4$-$C_{12}$ tertiary alkyl, $R^{13}$ is hydrogen, an optionally fluoro-substituted $C_1$-$C_{12}$ alkyl group, optionally fluoro-substituted $C_1$-$C_{12}$ alkoxy group, —$C(CF_3)_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^{14}$ is hydrogen or methyl, $R^{15}$ is hydrogen, methyl, alkoxycarbonyl, cyano, halogen or trifluoromethyl, $R^{16}$ is $C_4$-$C_{30}$ substituted or unsubstituted, and linear, branched or cyclic alkyl, n is 0 or a positive integer of 1 to 4, m is 0 or a positive integer of 1 to 5, p, r and s each are 0 or a positive number, and q is a positive number.

When the optionally substituted alkoxy group represented by $R^{13}$ has an acid labile group function, it is selected from a variety of such groups, preferably from a group of the following formula (6), a group of the following formula (7), and a straight, branched or cyclic $C_4$-$C_{20}$ tertiary alkoxy group. When $R^{13}$ is a tertiary alkoxy group, it is an alkoxy group excluding the tertiary alkyl group selected for $R^{12}$.

(6)

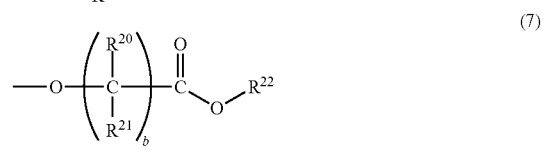

(7)

Herein $R^{17}$, $R^{18}$, $R^{19}$, $R^{20}$, and $R^{21}$ are each independently hydrogen, or a straight or branched $C_1$-$C_8$ alkyl group, a pair of $R^{17}$ and $R^{18}$, $R^{17}$ and $R^{19}$, or $R^{18}$ and $R^{19}$ may bond together to form a ring with the carbon atom or the carbon and oxygen atoms to which they are attached, each participant of $R^{17}$, $R^{18}$, and $R^{19}$ is a straight or branched $C_1$-$C_{18}$ alkylene group when they form a ring, $R^{22}$ is a straight, branched or cyclic $C_4$-$C_{40}$ alkyl group, and b is 0 or an integer of 1 to 4.

Suitable acid labile groups of formula (6) include methoxyethyl, ethoxyethyl, n-propoxyethyl, isopropoxyethyl, n-butoxyethyl, isobutoxyethyl, tert-butoxyethyl, cyclohexyloxyethyl, methoxypropyl, ethoxypropyl, 1-methoxy-1-methylethyl, and 1-ethoxy-1-methylethyl, to be bonded to the phenyl group via the oxygen atom. Suitable acid labile groups of formula (7) include tert-butoxycarbonyl, tert-butoxycarbonylmethyl, ethylcyclopentyloxycarbonyl, ethylcyclohexyloxycarbonyl, and methylcyclopentyloxycarbonyl, to be bonded to the phenyl group via the oxygen atom. Suitable trialkylsilyl groups include those in which each alkyl moiety has 1 to 6 carbon atoms.

In formula (5), $R^{10}$, $R^{11}$, and $R^{15}$ may be halogen. Exemplary halogens are fluorine, chlorine and bromine.

$R^{16}$ is an alkyl group which may be tertiary alkyl. Tertiary alkyl may be selected from optionally substituted alkyl groups of 4 to 30 carbon atoms, preferably those of the general formulae (8) and (9).

(8)

Herein $R^{23}$ is methyl, ethyl, isopropyl, cyclohexyl, cyclopentyl, vinyl, acetyl, phenyl, benzyl or cyano, and c is an integer of 0 to 3.

The cyclic alkyl groups of formula (8) are preferably 5- or 6-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

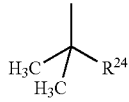

(9)

Herein $R^{24}$ is methyl, ethyl, isopropyl, cyclohexyl, cyclopentyl, vinyl, phenyl, benzyl or cyano.

Examples of the group of formula (9) include t-butyl, 1-vinyldimethylmethyl, 1-benzyldimethylmethyl, 1-phenyldimethylmethyl, and 1-cyanodimethylmethyl.

An alkyl group forming a tertiary ester as shown below is also preferred as $R^{16}$.

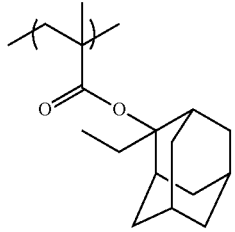

(10)-1

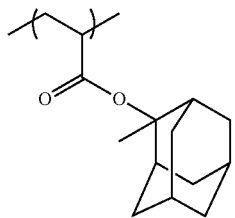

(10)-2

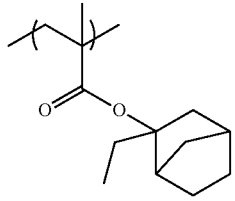

(10)-3

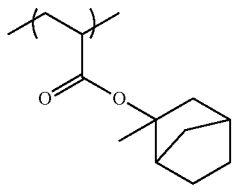

(10)-4

In formula (5), p, r and s each are 0 or a positive number, and q is a positive number. With properties of resist material taken into account, these subscripts preferably satisfy the following range: $0<q/(p+q+r+s)$ 0.5, more preferably $0<q/(p+q+r+s)\leq0.3$, $0\leq p/(p+q+r+s)\leq0.8$, more preferably $0.3\leq p/(p+q+r+s)\leq0.8$, $0\leq r/(p+q+r+s)\leq0.35$, with the proviso that r>0 when the polymer consist of four components, $0\leq s/(p+q+r+s)\leq0.35$, more preferably $0<s/(p+q+r+s)\leq0.3$, provided p+q+r+s=1.

In case q=0, indicating that a polymer of formula (5) does not contain the relevant unit (q), a contrast of alkali dissolution rate is lost, and resolution is worsened. If a proportion of p is too high, the unexposed region of film may have too high an alkali dissolution rate. By properly selecting the values of p, q, r and s within the above ranges, the size and profile of a pattern can be controlled as desired.

As the polymer or base resin, a novolak resin prepared by condensation of a cresol such as p-cresol or m-cresol and an aldehyde is also preferably used. A part of the hydrogen atoms on the benzene ring may be substituted by a protective group such as vinyl alkyl ether. The novolak resin preferably has a weight average molecular weight of 1,000 to 100,000, although the molecular weight of the novolak resin may be the ordinary one.

Component (2) is a photoacid generator capable of generating an acid in response to radiation or actinic light. The PAG is not particularly limited as long as it generates an acid upon exposure to high-energy radiation. Suitable PAGs include sulfonium salt, iodonium salt, sulfonyldiazomethane, and N-sulfonyloxyimide acid generators. Exemplary acid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations include aryl iodonium cations such as diphenyliodonium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate. Pyrogallol trisulfonate photoacid generators include pyrogallol, phloroglucinol, catechol, resorcinol, and hydroquinone, in which all hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Photoacid generators in the form of glyoxime derivatives include bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedionedioxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(4-fluorobenzenesulfonyl)-α-dimethylglyoxime,
bis-O-(4-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(4-fluorobenzenesulfonyl)-nioxime,
bis-O-(4-(trifluoromethyl)benzenesulfonyl)-nioxime, and
bis-O-(xylenesulfonyl)-nioxime. Also included are modified forms of the foregoing compounds having substituted on their skeleton 2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate, methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Photoacid generators in the form of oxime sulfonates with a long conjugated system separated by thiophene or cyclohexadiene include
(5-(p-toluenesulfonyl)oxyimino-5H-thiophen-2-ylidene)phenyl-acetonitrile,
(5-(10-camphorsulfonyl)oxyimino-5H-thiophen-2-ylidene)phenyl-acetonitrile, (5-n-octanesulfonyloxyimino-5H-thiophen-2-ylidene)phenyl-acetonitrile,
(5-(p-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile,
(5-(4-(p-toluenesulfonyloxy)benzenesulfonyl)oxyimino-5H-thiophen-2-ylidene)phenylacetonitrile, and
(5-(2,5-bis(p-toluenesulfonyloxy)benzenesulfonyl)oxyimino-5H-thiophen-2-ylidene)phenylacetonitrile.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable oxime sulfonates having an electron withdrawing group such as trifluoromethyl incorporated for increased stability include
2,2,2-trifluoro-1-phenyl-ethanone O-(methylsulfonyl)oxime,
2,2,2-trifluoro-1-phenyl-ethanone O-(10-camphorsulfonyl)oxime,
2,2,2-trifluoro-1-phenylethanone O-(4-methoxybenzenesulfonyl) oxime,
2,2,2-trifluoro-1-phenylethanone O-(1-naphthylsulfonyl)oxime,
2,2,2-trifluoro-1-phenylethanone O-(2-naphthylsulfonyl)oxime,
2,2,2-trifluoro-1-phenylethanone O-(2,4,6-trimethylphenylsulfonyl) oxime,
2,2,2-trifluoro-1-(4-methylphenyl)ethanone O-(10-camphor-sulfonyl) oxime,
2,2,2-trifluoro-1-(4-methylphenyl)ethanone O-(methyl-sulfonyl) oxime,
2,2,2-trifluoro-1-(2-methylphenyl)ethanone O-(10-camphor-sulfonyl)oxime,
2,2,2-trifluoro-1-(2,4-dimethylphenyl)ethanone O-(10-camphor-sulfonyl) oxime,
2,2,2-trifluoro-1-(2,4-dimethylphenyl)ethanone O-(1-naphthyl-sulfonyl) oxime,
2,2,2-trifluoro-1-(2,4-dimethylphenyl)-ethanone O-(2-naphthylsulfonyl)oxime,
2,2,2-trifluoro-1-(2,4,6-trimethylphenyl)ethanone O-(10-camphorsulfonyl)oxime,
2,2,2-trifluoro-1-(2,4,6-trimethylphenyl)ethanone O-(1-naphthylsulfonyl)oxime,
2,2,2-trifluoro-1-(2,4,6-trimethylphenyl)ethanone O-(2-naphthylsulfonyl)oxime,
2,2,2-trifluoro-1-(4-methoxyphenyl)ethanone O-(methyl-sulfonyl)oxime,
2,2,2-trifluoro-1-(4-methylthiophenyl)-ethanone O-(methyl-sulfonyl)oxime,
2,2,2-trifluoro-1-(3,4-dimethoxyphenyl)ethanone O-(methyl-sulfonyl)oxime,
2,2,2-trifluoro-1-(4-methoxyphenyl)ethanone O-(4-methyl-phenylsulfonyl) oxime,
2,2,2-trifluoro-1-(4-methoxyphenyl)ethanone O-(4-methoxy-phenylsulfonyl) oxime,
2,2,2-trifluoro-1-(4-methoxyphenyl)ethanone O-(4-dodecyl-phenylsulfonyl) oxime,
2,2,2-trifluoro-1-(4-methoxyphenyl)ethanone O-(octyl-sulfonyl) oxime,
2,2,2-trifluoro-1-(4-thiomethylphenyl)ethanone O-(4-methoxy-phenylsulfonyl)oxime,
2,2,2-trifluoro-1-(4-thiomethylphenyl)ethanone O-(4-dodecyl-phenylsulfonyl) oxime,
2,2,2-trifluoro-1-(4-thiomethylphenyl)ethanone O-(octyl-sulfonyl) oxime,
2,2,2-trifluoro-1-(4-thiomethylphenyl)ethanone O-(2-naphthyl-sulfonyl) oxime,
2,2,2-trifluoro-1-(2-methylphenyl)ethanone O-(methyl-sulfonyl)oxime,
2,2,2-trifluoro-1-(4-methylphenyl)ethanone O-(phenyl-sulfonyl) oxime,
2,2,2-trifluoro-1-(4-chlorophenyl)ethanone O-(phenyl-sulfonyl) oxime,
2,2,3,3,4,4,4-heptafluoro-1-phenylbutanone O-(10-camphor-sulfonyl)oxime,
2,2,2-trifluoro-1-(1-naphthyl)ethanone O-(methylsulfonyl) oxime,
2,2,2-trifluoro-1-(2-naphthyl)ethanone O-(methylsulfonyl) oxime,
2,2,2-trifluoro-1-(4-benzylphenyl)ethanone O-(methyl-sulfonyl)oxime,
2,2,2-trifluoro-1-(4-(phenyl-1,4-dioxa-but-1-yl)phenyl)-ethanone O-(methylsulfonyl)oxime,
2,2,2-trifluoro-1-(1-naphthyl)ethanone O-(propylsulfonyl) oxime,
2,2,2-trifluoro-1-(2-naphthyl)ethanone O-(propylsulfonyl) oxime,
2,2,2-trifluoro-1-(4-benzylphenyl)ethanone O-(propyl-sulfonyl) oxime,
2,2,2-trifluoro-1-(4-methylsulfonylphenyl)ethanone O-(propyl-sulfonyl) oxime,
2,2,2-trifluoro-1-(4-methylsulfonyloxyphenyl)ethanone O-(propylsulfonyl)oxime,
2,2,2-trifluoro-1-(4-methylcarbonyloxyphenyl)ethanone O-(propylsulfonyl)oxime,
2,2,2-trifluoro-1-(6H,7H-5,8-dioxonaphth-2-yl)ethanone O-(propylsulfonyl)oxime,
2,2,2-trifluoro-1-(4-methoxycarbonylmethoxyphenyl)ethanone O-(propylsulfonyl)oxime,
2,2,2-trifluoro-1-(4-methoxycarbonyl)-(4-amino-1-oxa-pent-1-yl)phenyl)ethanone O-(propylsulfonyl)oxime,
2,2,2-trifluoro-1-(3,5-dimethyl-4-ethoxyphenyl)ethanone O-(propylsulfonyl)oxime,
2,2,2-trifluoro-1-(4-benzyloxyphenyl)ethanone O-(propylsulfonyl) oxime,
2,2,2-trifluoro-1-(2-thiophenyl)ethanone O-(propylsulfonate)-oxime, and 2,2,2-trifluoro-1-(1-dioxathiophen-2-yl)ethanone O-(propyl-sulfonate) oxime;
2,2,2-trifluoro-1-(4-(3-(4-(2,2,2-trifluoro-1-(trifluoro-methanesulfonyloxyimino)ethyl)phenoxy)propoxy)phenyl)ethanone O-(trifluoromethanesulfonyl)oxime,
2,2,2-trifluoro-1-(4-(3-(4-(2,2,2-trifluoro-1-(1-propane-sulfonyloxyimino)ethyl)phenoxy)propoxy)phenyl)ethanone O-(propylsulfonyl)oxime,
2,2,2-trifluoro-1-(4-(3-(4-(2,2,2-trifluoro-1-(1-butane-sulfonyloxyimino)ethyl)phenoxy)propoxy)phenyl)ethanone O-(butylsulfonyl)oxime,
2,2,2-trifluoro-1-(4-(3-(4-(2,2,2-trifluoro-1-(4-(4-methylphenylsulfonyloxy)phenylsulfonyloxyimino)ethyl)phenoxy)-propoxy)phenyl)ethanone O-(4-(4-methylphenylsulfonyloxy)-phenylsulfonyl)oxime, and
2,2,2-trifluoro-1-(4-(3-(4-(2,2,2-trifluoro-1-(2,5-bis(4-methylphenylsulfonyloxy)benzenesulfonyloxy)phenylsulfonyloxy-imino)ethyl)phenoxy)propoxy)phenyl)ethanone O-(2,5-bis(4-methylphenylsulfonyloxy)benzenesulfonyloxy)phenylsulfonyl)oxime.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Also included are oxime sulfonates having the formula (Ox-1):

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is substituted or unsubstituted aromatic or hetero-aromatic group.

Examples include
2-[2,2,3,3,4,4,5,5-octafluoro-1-(nonafluorobutylsulfonyl-oxyimino)-pentyl]fluorene,
2-[2,2,3,3,4,4-pentafluoro-1-(nonafluorobutylsulfonyl-oxyimino)-butyl]fluorene,
2-[2,2,3,3,4,4,5,5,6,6-decafluoro-1-(nonafluorobutylsulfonyl-oxyimino)-hexyl]fluorene,
2-[2,2,3,3,4,4,5,5-octafluoro-1-(nonafluorobutylsulfonyl-oxyimino)-pentyl]-4-biphenyl,
2-[2,2,3,3,4,4-pentafluoro-1-(nonafluorobutylsulfonyl-oxyimino)-butyl]-4-biphenyl, and
2-[2,2,3,3,4,4,5,5,6,6-decafluoro-1-(nonafluorobutylsulfonyl-oxyimino)-hexyl]-4-biphenyl.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable oxime sulfonate generators using substituted acetonitrile derivatives include
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]-acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are modified forms of the foregoing compounds having substituted on their skeleton 2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable bisoxime sulfonates include
bis(α-(p-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(E-(butanesulfonyloxy)imino)-p-phenylenediacetonitrile,
bis(α-(10-camphorsulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(p-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethanesulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Among these, the preferred PAGs are sulfonium salts, bissulfonyldiazomethanes, N-sulfonyloxyimides, and sulfonyloxime compounds.

Although the optimum anion of the generated acid varies with such factors as ease of scission of the acid labile group in the polymer, an anion which is non-volatile and not extremely highly diffusive is generally selected.

Appropriate anions include anions of benzenesulfonic acid, toluenesulfonic acid,
4-(4-toluenesulfonyloxy)benzenesulfonic acid,
pentafluorobenzenesulfonic acid,
2,2,2-trifluoroethanesulfonic acid,
nonafluorobutanesulfonic acid,
heptadecafluorooctanesulfonic acid, and camphorsulfonic acid.

The PAG (2) is added to the chemically amplified positive resist composition in an amount of 0.2 to 20 parts, preferably 0.5 to 10 parts by weight per 100 parts by weight of the polymer or base resin. The PAG may be used alone or in admixture of two or more. The transmittance of the resist film can be controlled by using a PAG having a low transmittance at the exposure wavelength and adjusting the amount of the PAG added.

The chemically amplified positive resist composition further comprises a component having a boiling point of 55 to 250° C. under atmospheric pressure. The component having a boiling point of 55 to 250° C. under atmospheric pressure preferably has such nature that the polymer (1) and the PAG (2) may be uniformly dissolved therein. In this sense, any solvents may be used as long as they have a sufficient solubility to the polymer (1) and the PAG (2) and ensure effective coating.

As the b.p. 55-250° C. component, organic solvents are preferred because of availability. Suitable organic solvents include cellosolve solvents such as methyl cellosolve, ethyl cellosolve, methyl cellosolve acetate, and ethyl cellosolve acetate; propylene glycol solvents such as propylene glycol, dipropylene glycol, propylene glycol monomethyl ether, propylene glycol monobutyl ether, propylene glycol monomethyl ether acetate, propylene glycol dimethyl ether, and propylene glycol monoethyl ether acetate; ester solvents such as butyl acetate, amyl acetate, methyl lactate, ethyl lactate, ethyl 3-methoxypropionate, and ethyl 3-ethoxypropionate; alcohol solvents such as methanol, ethanol, isopropanol, hexanol, and diacetone alcohol; ketone solvents such as acetone, cyclohexanone, cyclopentanone, methyl ethyl ketone, methyl amyl ketone, and methyl isobutyl ketone; ether solvents such as methyl phenyl ether and diethylene glycol dimethyl ether; highly polar solvents such as N,N-dimethylformamide, N-methylpyrrolidone, and dimethyl sulfoxide, and mixtures thereof. Preferred are propylene glycol solvents, ester solvents, ketone solvents, or mixtures thereof.

An amount of the solvent used is desirably 20 to 400 parts, more desirably 50 to 150 parts by weight per 100 parts by weight of the resist solids. If the amount of the solvent is below the range, problems may arise in forming a dry film, for example, the film thickness distribution is aggravated, and bubbles are introduced into the film. If the amount of the solvent is excessive, it may be difficult to form a dry film of desired thickness.

A solvent having a b.p. of lower than 55° C. is undesirable in that it is so volatile at room temperature that a substantial concentration change occurs during handling. A solvent having a b.p. of higher than 250° C. is undesirable because the pattern profile may be aggravated.

Various additives may be added to the resist composition as long as the effects of the invention are not impaired. Suitable additives include a basic compound, acid amplifier, photobase generator, thermoplastic resin, photosensitive agent, dye, dissolution promoter, crosslinker, and surfactant. These additives may be added in conventional amounts, depending on their purpose.

The basic compound is preferably a compound capable of holding down the diffusion rate of acid when the acid generated by the PAG diffuses in the resist film. The inclusion of the basic compound holds down the diffusion rate of acid in the resist film, which leads to many advantages including improved resolution, minimized sensitivity change following exposure, reduced substrate poisoning and environment dependency, and improved exposure latitude and pattern profile.

Examples of the basic compound include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds with sulfonyl group include 3-pyridinesulfonic acid and pyridinium p-toluenesulfonate. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_c(Y)_{3-c} \quad (B)\text{-}1$$

In the formula, c is equal to 1, 2 or 3; side chain Y is independently hydrogen or a straight, branched or cyclic $C_1$-$C_{20}$ alkyl group which may contain a hydroxyl or ether moiety; and side chain X is independently selected from groups of the following general formulas (X)-1 to (X)-3, and two or three X may bond together to form a ring with the nitrogen atom to which they are attached.

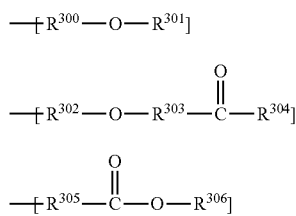

In the formulas, $R^{300}$, $R^{302}$ and $R^{305}$ are independently a straight or branched $C_1$-$C_4$ alkylene group. $R^{301}$ and $R^{304}$ are independently hydrogen, or a straight, branched or cyclic $C_1$-$C_{20}$ alkyl group which may contain at least one hydroxyl, ether or ester moiety or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl, ether or ester moiety or lactone ring.

Illustrative examples of the basic compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

The basic compounds may be used alone or in admixture of two or more. The basic compound is preferably formulated in an amount of 0 to 2 parts, and especially 0.01 to 1 part by weight per 100 parts by weight of the base resin. More than 2 parts of the basic compound may result in too low a sensitivity.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, Surflon S-381, Surfynol E1004, KH-20 and KH-30 are preferred. These surfactants may be used alone or in admixture.

In the resist composition, the surfactant is formulated in an amount of up to 2 parts, and preferably up to 1 part by weight per 100 parts by weight of the base resin. Any of the foregoing additives may be used if necessary.

Now the method for preparing the dry film and the dry film laminate containing the same is described. The chemically amplified positive resist composition may be prepared by combining the above-described components, specifically by dissolving (1) the polymer which turns soluble in alkaline aqueous solution under the action of acid and (2) the photoacid generator capable of generating an acid in response to radiation or actinic light in the organic solvent, optionally adding selected additives, and stirring, thus yielding a uniform chemically amplified positive resist composition solution. The solution may be passed through a filter, if necessary.

A dry film is generally manufactured in a clean room having a cleanness of up to 1,000. The clean room includes a zone kept at a temperature of 5 to 45° C., preferably 15 to 35° C. and a humidity of 5 to 90%, preferably 10 to 70%, where a film coater is set. Examples of the film coater include a forward roll coater, reverse roll coater, comma coater, die coater, lip coater, gravure coater, dip coater, air knife coater, capillary coater, raising and rising (R&R) coater, blade coater, bar coater, applicator, and extrusion molding machine. By means of the film coater, the chemically amplified positive resist composition solution is coated onto a support film (or parting substrate). The coating rate is 0.05 to 1,000 m/min, preferably 0.1 to 500 m/min. The support film (or parting substrate) having the solution coated thereon is passed through an inline dryer (hot air circulating oven), preferably at 40 to 130° C. for 1 to 40 minutes, more preferably at 50 to 120° C. for 2 to 30 minutes, for removing the organic solvent and volatile component, that is, drying, thereby forming a chemically amplified positive resist dry film. If necessary, a protective film (or another parting substrate) may be press bonded to the dry film by means of a roll laminator, to complete a dry film laminate.

Using the manufacture line including suitable forming conditions and a coater/laminator for coating the resist composition solution onto the support film, the resist dry film can be continuously manufactured in film roll form. A film roll of desired shape is easy to handle. This is also true when the resist dry film is overlaid with the protective film.

The inclusion of 5 to 40% by weight, preferably 10 to 35% by weight of the b.p. 55-250° C. component ensures that the chemically amplified positive resist dry film is formed. If the content of b.p. 55-250° C. component is less than 5% by weight, undesirably the resulting dry film becomes so hard that it may crack. If the content of b.p. 55-250° C. component exceeds 40% by weight, undesirably the solution does not convert to a dry film, that is, a failure to secure a chemically amplified positive resist dry film to the support film. Understandably, the balance of the resist dry film excluding the b.p. 55-250° C. component consists essentially of the polymer and the PAG and optionally contains additives such as basic compound and a solvent other than the b.p. 55-250° C. component.

In a preferred embodiment, the resist dry film contains 5 to 40% by weight, more preferably 10 to 30% by weight of a volatile component which volatilizes during heat treatment at 150° C. for 1 hour. A volatile content of less than 5 wt % is undesirable because of potential cracking whereas a volatile content of more than 40 wt % is undesirable because of a failure to secure a resist dry film to the support film. The volatile content includes the organic solvent used upon dissolving the starting material and a low molecular weight component (an impurity) derived from the starting material.

In order to obtain the dry film containing 5 to 40% by weight of a component having a boiling point of 55 to 250° C. under atmospheric pressure, it is preferable to adequately control the dry conditions upon forming the dry film layer to 40 to 130° C. for 1 to 40 minutes.

The chemically amplified positive resist dry film should preferably have a thickness of 5 to 250 microns (μm), more preferably 10 to 150 μm.

The support film serving as a parting substrate and the optional protective film are not particularly limited as long as they do not adversely affect the shape and form (or topography) of the resist dry film and are strippable from the resist dry film. The support film (and protective film) may be a single film or a multilayer film consisting of a plurality of stacked polymer layers. Suitable plastic films include nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-polymer film, special polyvinyl alcohol (PVA) film, and polyester film treated for parting.

As the support film, the PET film is preferred due to appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38×1-A3, PET38×1-V8 and PET38×1-X08 from Nippa Co., Ltd.

As the protective film, the PET and PE films having an appropriate flexibility are preferred. Such films are also commercially available. For example, PET films are as mentioned above, and PE films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of dry film, and prevention of wrapping on a take-up roll, i.e., anti-curling.

In the dry film laminate of support film/dry film/protective film, the protective film should preferably require a stripping force of 1 to 500 gf/24 mm on stripping from the dry film. The test method is according to JIS 20237 "Bond strength testing method in stripping release liner from pressure-sensitive adhesive tape surface". The testing environment is under standard conditions (temperature 23±1° C., relative humidity 50±5%). A film sample to be tested has a width of 24 mm. A variation of film width is undesirable because the stripping force is accordingly changed. After a film sample of the predetermined size is prepared, the protective film is stripped by pulling it back at an angle of 180° and a rate of 5.0±0.2 mm/sec. Among measurements, initial measurements over starting distance 25 mm are taken off, and measurements over subsequent distance 50 mm are averaged and reported as the test value.

The dry film of the present invention is preferably used for through electrode in semiconductor and MEMS fields.

EXAMPLE

Synthesis Examples, Examples and Comparative Examples are given below by way of illustration and not by way of limitation. All parts are by weight (pbw).

Polymers obtained in Synthesis Examples 1 to 3 are used as the polymer which turns soluble in alkaline aqueous solution under the action of acid.

Synthesis Example 1

A 2-L flask was charged with 66.5 g of p-acetoxystyrene, 33.5 g of p-amyloxystyrene, and 200 g of toluene as solvent. The reactor was cooled at −70° C. in a nitrogen atmosphere, after which vacuum pumping and nitrogen flow were repeated three times. The reactor was warmed up to room temperature, whereupon 3.9 g of azobisisobutyronitrile (AIBN) was added. The reactor was heated at 60° C., whereupon reaction ran for 15 hours. The reaction solution was concentrated to half volume, and poured into a mixture of 4.5 L of methanol and 0.5 L of water for precipitation. The resulting white solid was filtered and vacuum dried at 60° C., obtaining 92 g of a white polymer. The polymer was dissolved again in 0.27 L of methanol and 0.27 L of tetrahydrofuran, to which 77 g of triethylamine and 15 g of water were added for deprotection reaction, followed by neutralization with acetic acid. The reaction solution was concentrated and dissolved in 0.5 L of acetone. This was followed by similar precipitation, filtration and drying, yielding 61 g of a white polymer.

The polymer was analyzed by $^{13}$C and $^{1}$H-NMR spectroscopy and GPC, with the results shown below.

Copolymer Compositional Ratio (Molar Ratio)

hydroxystyrene:amyloxystyrene=72.5:27.5
Mw=16,100
Mw/Mn=1.73
This polymer is designated Poly-1.

Synthesis Example 2

A 2-L flask was charged with 71.5 g of p-acetoxystyrene, 22.4 g of p-amyloxystyrene, 8.1 g of 1-ethylcyclopentyl methacrylate, and 200 g of toluene as solvent. The reactor was cooled at −70° C. in a nitrogen atmosphere, after which vacuum pumping and nitrogen flow were repeated three times. The reactor was warmed up to room temperature, whereupon 3.9 g of AIBN was added. The reactor was heated at 60° C., whereupon reaction ran for 15 hours. The reaction solution was concentrated to half volume, and poured into a mixture of 4.5 L of methanol and 0.5 L of water for precipitation. The resulting white solid was filtered and vacuum dried at 60° C., obtaining 89 g of a white polymer. The polymer was dissolved again in 0.27 L of methanol and 0.27 L of tetrahydrofuran, to which 77 g of triethylamine and 14 g of water were added for deprotection reaction, followed by neutralization with acetic acid. The reaction solution was concentrated and dissolved in 0.5 L of acetone. This was followed by similar precipitation, filtration and drying, yielding 55 g of a white polymer.

The polymer was analyzed by $^{13}$C and $^{1}$H-NMR spectroscopy and GPC, with the results shown below.

Copolymer Compositional Ratio (Molar Ratio)

hydroxystyrene:amyloxystyrene:1-ethylcyclopentyl methacrylate=70.9:21.9:7.2
Mw=17,000
Mw/Mn=1.70
This polymer is designated Poly-2.

Synthesis Example 3

Using a phenol mixture of 6/4 (molar ratio) m-cresol and p-cresol and an aldehyde mixture of 1/0.3 (molar ratio) formaldehyde and salicylaldehyde, a novolak resin, designated Novolak 1, having Mw=5,500 and Mw/Mn=10 was synthesized by the standard technique. With stirring, Novolak 1 was dissolved in methyl isobutyl ketone (MIBK) in a concentration of 30 wt %. To the solution kept at a temperature of 100-110° C., a compound of the formula shown below was added dropwise in an amount of 8 parts by weight per 100 parts by weight of the resin solid. After 24 hours of reaction, stirring was continued at room temperature for 15 hours. This was followed by solvent displacement from MIBK to propylene glycol monomethyl ether acetate (PMA), yielding a polymer having Mw=37,000 in which 7.5 molt of hydroxyl groups on Novolak 1 were protected. This polymer is designated Poly-3.

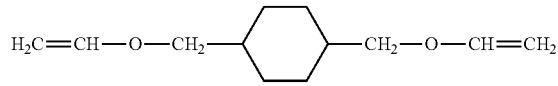

Examples and Comparative Examples

Compositions #1 to #7 (chemically amplified positive resist compositions) were prepared by uniformly mixing a polymer and a PAG in an organic solvent according to the formulation shown in Table 1. The PAGs (capable of generating an acid in response to radiation or actinic light) used herein are PAI-101 (Midori Kagaku Co., Ltd., PAG-1), IRGACURE PAG121 (BASF, PAG-2), and HT-1CS (San-Apro Ltd., PAG-3). The organic solvents used herein are propylene glycol monomethyl ether acetate (PMA), propylene glycol (PB), cyclopentanone (CyP), and ethyl lactate (EL).

TABLE 1

| Composition | Polymer (pbw) | PAG (pbw) | Organic solvent* (pbw) |
|---|---|---|---|
| #1 | Poly-1 (100) | PAG-1 (1.0) | PMA (100) |
| #2 | Poly-1 (100) | PAG-2 (0.5) | PMA/PG = 9/1 (100) |
| #3 | Poly-1 (100) | PAG-3 (1.0) | PMA/CyP = 9/1 (100) |
| #4 | Poly-2 (100) | PAG-1 (0.5) | PMA/EL = 8/2 (200) |
| #5 | Poly-2 (100) | PAG-2 (1.0) | EL/PG = 8/2 (300) |

TABLE 1-continued

| Composition | Polymer (pbw) | PAG (pbw) | Organic solvent* (pbw) |
|---|---|---|---|
| #6 | Poly-2 (100) | PAG-3 (1.5) | PMA/CyP = 9/1 (50) |
| #7 | Poly-3 (100) | PAG-1 (1.5) | PMA (80) |

*The mix ratio of organic solvents is by weight.

Each chemically amplified positive resist composition was filtered through a Teflon® filter with a pore size of 1.0 μm.

A die coater was used as the film coater and a polyethylene terephthalate (PET) film of 38 μm thick used as the support film. Each composition was coated onto the support film at a coating rate of 0.8 m/min and dried in a hot air circulating oven to form a chemically amplified positive resist dry film. The temperature of the oven and the thickness of the dry film are shown in Table 2.

Thereafter, a polyethylene (PE) film of 50 μm thick or PET film of 25 μm thick as the protective film was bonded to the surface of the chemically amplified positive resist dry film under a pressure of 1 MPa, yielding a dry film laminate.

TABLE 2

| | | Composition | Oven temperature (° C.) | Film thickness (μm) | Protective film |
|---|---|---|---|---|---|
| Example | 1 | #1 | 50 | 60 | PE |
| | 2 | #2 | 70 | 50 | PE |
| | 3 | #3 | 80 | 47 | PE |
| | 4 | #4 | 120 | 35 | PE |
| | 5 | #5 | 100 | 23 | PE |
| | 6 | #6 | 60 | 81 | PE |
| | 7 | #7 | 100 | 48 | PE |
| | 8 | #3 | 60 | 58 | PE |
| | 9 | #4 | 70 | 45 | PET |
| | 10 | #6 | 50 | 96 | PET |
| Comparative Example | 1 | #1 | 150 | 39 | PE |
| | 2 | #3 | 150 | 40 | PE |
| | 3 | #5 | 150 | 20 | PE |
| | 4 | #6 | 30 | 102 | PE |
| | 5 | #7 | 30 | 79 | PE |

Analysis was made on the dry films of Examples and Comparative Examples in Table 2.

Measurement of Volatile Content

Using an electronic balance (XS204 by Mettler-Toledo International Inc.), an about 1-g sample of the dry film was precision weighed on an aluminum dish. Using a dryer (ST-110, Espec Corp.) set in a room maintained at atmospheric pressure, temperature 25±5° C., relative humidity 50±15%, the sample was treated at 150° C. for 1 hour. The aluminum dish was taken out of the dryer, cooled in a desiccator for 5 minutes, and weighed again by means of the electronic balance. A change in weight before and after the admission into the dryer was determined and reported as the volatile content.

Measurement of b.p. 55-250° C. Component

The content of a component having a boiling point of 55-250° C. under atmospheric pressure was measured. Thermogravimetric analysis was carried out. A 10-mg sample was precision weighed on a sample pan. Using an analyzer TG8120 (Rigaku Co., Ltd.), the sample was heated from 30° C. to 300° C. at a rate of 5° C./min under atmospheric pressure. The content was determined by subtracting the thermogravimetric weight loss in the range of 30 to 55° C. from the thermogravimetric weight loss in the range of 30 to 250° C. The results are shown in Table 3.

Measurement of Stripping Force

The force needed to strip the protective film from the dry film was measured. The dry film laminate was cut into a piece of 300 mm long and 24 mm wide. A stripping force was measured by using Autograph AGS-X (Shimadzu Corp.) and stripping the protective film from the dry film.

To confirm flexibility, the dry film was cut into a piece of 100 mm long and 24 mm wide. It was observed whether or not cracks formed when the piece was rounded into a longitudinal cylinder by joining the opposed side edges. The results are shown in Table 3.

TABLE 3

| | | boiling point 55-250° C. component (wt %) | Volatile content (wt %) | Stripping force (gf/24 mm) | Flexibility |
|---|---|---|---|---|---|
| Example | 1 | 38.8 | 36 | 90 | OK |
| | 2 | 24.0 | 22 | 30 | OK |
| | 3 | 19.8 | 17 | 20 | OK |
| | 4 | 10.5 | 8 | 2.5 | OK |
| | 5 | 18.8 | 15 | 6.0 | OK |
| | 6 | 27.7 | 26 | 65 | OK |
| | 7 | 12.4 | 10 | 4.5 | OK |
| | 8 | 35.2 | 32 | 75 | OK |
| | 9 | 31.5 | 28 | 180 | OK |
| | 10 | 40.0 | 38 | 300 | OK |
| Comparative Example | 1 | 3.0 | 2 | 0 | NG (cracked) |
| | 2 | 4.3 | 2 | 0 | NG (cracked) |
| | 3 | 4.6 | 3 | 0 | NG (cracked) |
| | 4 | 45.5 | 42 | dry film broken in test | OK |
| | 5 | 49.0 | 45 | dry film broken in test | OK |

Finally, it was confirmed whether or not a pattern could be formed using the chemically amplified positive resist dry film of Example 1. The protective film was stripped off from the laminate. Using a vacuum laminator TEAM-300M (Takatori Corp.) with a vacuum chamber set at a vacuum of 80 Pa and a temperature of 100° C., the dry film on the support film was closely bonded to a silicon substrate of 300 mm. After restoration of atmospheric pressure, the substrate was taken out of the laminator, and the support film was stripped off. The dry film/substrate was soft baked on a hot plate at 120° C. for 5 minutes to enhance the bond between the dry film and the substrate. Using an optical interference film thickness gauge (M6100, Nanometrics Inc.), the thickness of the dry film after soft bake was measured to be 45 μm. Using i-line stepper NSR-2205i11D (Nikon Corp.), the dry film was imagewise exposed, baked (PEB) on a hot plate at 110° C. for 90 seconds, and developed in an alkaline developer, 2.38 wt % TMAH aqueous solution for 200 seconds.

The cross-sectional profile of the dry film/substrate was observed under scanning electron microscope (S-4700, Hitachi High-Technologies), confirming the resolution of a 20-μm hole pattern.

Japanese Patent Application No. 2014-182423 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist dry film to be formed on a support film, comprising 5 to 40% by weight of a component having a boiling point of 55 to 250° C. under atmospheric pressure, a base polymer which turns soluble in alkaline aqueous solution under the action of acid, and a photoacid generator consisting of a compound capable of generating an acid having a sulfonate anion in response to radiation or actinic light, so that the resist dry film may dissolve in alkaline aqueous solution upon receipt of radiation or actinic light, wherein the base polymer is represented by the general formula (5) and has a weight average molecular weight of 1,000 to 500,000,

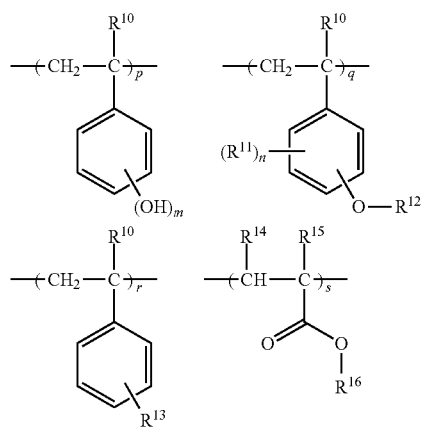

(5)

wherein $R^{10}$ is hydrogen, hydroxyl, straight $C_1$-$C_6$ alkyl, branched $C_3$-$C_6$ alkyl, halogen or trifluoromethyl, $R^{11}$ is hydrogen, hydroxyl, halogen or trifluoromethyl, $R^{12}$ is $C_4$-$C_{12}$ tertiary alkyl, $R^{13}$ is hydrogen, an optionally fluoro-substituted $C_1$-$C_{12}$ alkyl group, optionally fluoro-substituted $C_1$-$C_{12}$ alkoxy group, —C(CF$_3$)$_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^{14}$ is hydrogen or methyl, $R^{15}$ is hydrogen, methyl, alkoxycarbonyl, cyano, halogen or trifluoromethyl, $R^{16}$ is $C_4$-$C_{30}$ substituted or unsubstituted cyclic alkyl, n is 0 or a positive integer of 1 to 4, m is 0 or a positive integer of 1 to 5, p, r and s each are 0 or a positive number, and q is a positive number, satisfying the following range: $0<q/(p+q+r+s)\leq0.5$, $0.3\leq p/(p+q+r+s)\leq0.8$, $0\leq r/(p+q+r+s)\leq0.35$, $0\leq s/(p+q+r+s)\leq0.35$, provided $p+q+r+s=1$.

2. The resist dry film of claim 1 which contains 5 to 40% by weight of a component which volatilizes during heat treatment at 150° C. for 1 hour.

3. The resist dry film of claim 1 wherein the component having a boiling point of 55 to 250° C. under atmosphere pressure is an organic solvent.

4. A dry film laminate comprising the chemically amplified positive resist dry film of claim 1, a support film laminated on one surface of the dry film, and a protective film laminated on another surface of the dry film, the protective film having a stripping force of 1 to 500 gf/24 mm for stripping from the dry film.

5. The resist dry film of claim 1 wherein the component having a boiling point of 55 to 250° C. under atmospheric pressure is a single organic solvent selected from the group consisting of:
a cellosolve solvent selected from the group consisting of methyl cellosolve, ethyl cellosolve, methyl cellosolve acetate, and ethyl cellosolve acetate;
a propylene glycol solvent selected from the group consisting of propylene glycol, dipropylene glycol, propylene glycol monomethyl ether, propylene glycol monobutyl ether, propylene glycol dimethyl ether, and propylene glycol monoethyl ether acetate;
an ester solvent selected from the group consisting of butyl acetate, amyl acetate, methyl lactate, ethyl lactate, ethyl 3-methoxypropionate, and ethyl 3-ethoxypropionate;
an alcohol solvent selected from the group consisting of methanol, ethanol, isopropanol, hexanol, and diacetone alcohol;
a ketone solvent selected from the group consisting of acetone, cyclohexanone, cyclopentanone, methyl ethyl ketone, methyl amyl ketone, and methyl isobutyl ketone;
ether solvents selected from the group consisting of methyl phenyl ether and diethylene glycol dimethyl ether; and
a highly polar solvent selected from the group consisting of N,N-dimethylformamide, N-methylpyrrolidone, and dimethyl sulfoxide.

6. The resist dry film of claim 1 wherein the component having a boiling point of 55 to 250° C. under atmospheric pressure is a mixed solvent of at least two organic solvents selected from the group consisting of:
a cellosolve solvent selected from the group consisting of methyl cellosolve, ethyl cellosolve, methyl cellosolve acetate, and ethyl cellosolve acetate;
a propylene glycol solvent selected from the group consisting of propylene glycol, dipropylene glycol, propylene glycol monomethyl ether, propylene glycol monobutyl ether, propylene glycol monomethyl ether acetate, propylene glycol dimethyl ether, and propylene glycol monoethyl ether acetate;
an ester solvent selected from the group consisting of butyl acetate, amyl acetate, methyl lactate, ethyl lactate, ethyl 3-methoxypropionate, and ethyl 3-ethoxypropionate;
an alcohol solvent selected from the group consisting of methanol, ethanol, isopropanol, hexanol, and diacetone alcohol;
a ketone solvent selected from the group consisting of acetone, cyclohexanone, cyclopentanone, methyl ethyl ketone, methyl amyl ketone, and methyl isobutyl ketone;
ether solvents selected from the group consisting of methyl phenyl ether and diethylene glycol dimethyl ether; and
a highly polar solvent selected from the group consisting of N,N-dimethylformamide, N-methylpyrrolidone, and dimethyl sulfoxide.

7. The resist dry film of claim 1 wherein the sulfonate anion is selected from the group consisting of benzenesulfonic acid, toluenesulfonic acid, 4-(4-toluenesulfonyloxy)benzenesulfonic acid, pentafluorobenzenesulfonic acid, 2,2, 2-trifluoroethanesulfonic acid, nonafluorobutanesulfonic acid, heptadecafluorooctanesulfonic acid, and camphorsulfonic acid anions.

8. The resist dry film of claim 1 wherein the photoacid generator is selected from the group consisting of iodonium salts, sulfonyldiazomethane compounds, N-sulfonyloxyimides, benzoinsulfonates, pyrogallol tri sulfonates, nitrobenzyl sulfonates, sulfones, O-arylsulfonyloxime compounds and O-alkylsulfonyloxime compounds.

9. The resist dry film of claim 1 wherein $R^{16}$ is a cyclic alkyl group represented by the following formula (8):

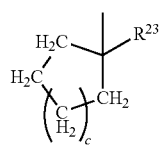
(8)

wherein $R^{23}$ is methyl, ethyl, isopropyl, cyclohexyl, cyclopentyl, vinyl, acetyl, phenyl, benzyl or cyano, and c is an integer of 0 to 3.

10. The resist dry film of claim 1 wherein $0<s/(p+q+r+s)\leq0.35$.

11. A method for preparing a dry film laminate, comprising the steps of:
  (i) coating a chemically amplified positive resist composition solution on a support film, and
  (ii) heating the resist composition solution to remove an organic solvent and a volatile component therefrom and to form a chemically amplified positive resist dry film,
  wherein the dry film comprises 5 to 40% by weight of a component having a boiling point of 55 to 250° C. under atmospheric pressure, a base polymer which turns soluble in alkaline aqueous solution under the action of acid, and a photoacid generator capable of generating an acid in response to radiation or actinic light, so that the resist dry film may dissolve in alkaline aqueous solution upon receipt of radiation or actinic light,
  wherein the base polymer is represented by the general formula (5) and has a weight average molecular weight of 1,000 to 500,000,

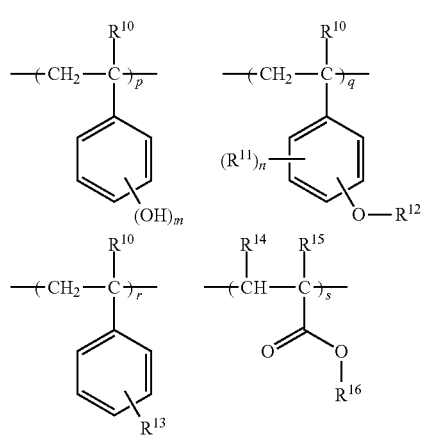
(5)

wherein $R^{10}$ is hydrogen, hydroxyl, straight $C_1$-$C_6$ alkyl, branched $C_3$-$C_6$ alkyl, halogen or trifluoromethyl, $R^{11}$ is hydrogen, hydroxyl, halogen or trifluoromethyl, $R^{12}$ is $C_4$-$C_{12}$ tertiary alkyl, $R^{13}$ is hydrogen, an optionally fluoro-substituted $C_1$-$C_{12}$ alkyl group, optionally fluoro-substituted $C_1$-$C_{12}$ alkoxy group, —C(CF$_3$)$_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^{14}$ is hydrogen or methyl, $R^{15}$ is hydrogen, methyl, alkoxycarbonyl, cyano, halogen or trifluoromethyl, $R^{16}$ is $C_4$-$C_{30}$ substituted or unsubstituted cyclic alkyl, n is 0 or a positive integer of 1 to 4, m is 0 or a positive integer of 1 to 5, p, r and s each are 0 or a positive number, and q is a positive number, satisfying the following range: $0<q/(p+q+r+s)\leq0.5$, $0.3\leq p/(p+q+r+s)\leq0.8$, $0\leq r/(p+q+r+s)\leq0.35$, $0\leq s/(p+q+r+s)\leq0.35$, provided $p+q+r+s=1$.

12. The method of claim 11 which further comprises
  laminating a protective film on the dry film after the step (ii), and
  stripping the protective film from the dry film;
  wherein the stripping force of stripping the protective film from the dry film is 1 to 500 gf/24 mm.

13. A method for preparing a dry film laminate, comprising the steps of:
  (iii) continuously coating a chemically amplified positive resist composition solution onto a support film at a rate of 0.05 to 1,000 m/min,
  (iv) heating the resist composition solution to remove an organic solvent and a volatile component therefrom to form a dry film/support film laminate, the dry film containing 5 to 40% by weight of a component having a boiling point of 55 to 250° C. under atmospheric pressure, and
  (v) continuously winding the laminate into a roll form,
  wherein the chemically amplified positive resist composition comprises a base polymer and the base polymer is represented by the general formula (5) and has a weight average molecular weight of 1,000 to 500,000,

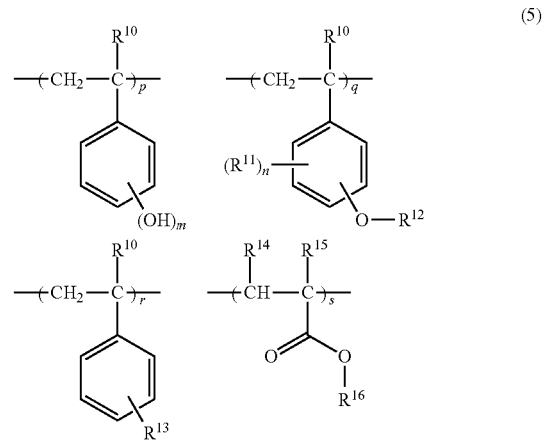
(5)

wherein $R^{10}$ is hydrogen, hydroxyl, straight $C_1$-$C_6$ alkyl, branched $C_3$-$C_6$ alkyl, halogen or trifluoromethyl, $R^{11}$ is hydrogen, hydroxyl, halogen or trifluoromethyl, $R^{12}$ is $C_4$-$C_{12}$ tertiary alkyl, $R^{13}$ is hydrogen, an optionally fluoro-substituted $C_1$-$C_{12}$ alkyl group, optionally fluoro-substituted $C_1$-$C_{12}$ alkoxy group, —C(CF$_3$)$_2$—OH, trialkylsiloxy group in which each alkyl moiety has 1 to 6 carbon atoms, $C_4$-$C_{20}$ oxoalkoxy group, tetrahydropyranyloxy group, tetrahydrofuranyloxy group, or trialkylsiloxy group, $R^{14}$ is hydrogen or methyl, $R^{15}$ is hydrogen, methyl, alkoxycarbonyl, cyano, halogen or trifluoromethyl, $R^{16}$ is $C_4$-$C_{30}$ substituted or unsubstituted cyclic alkyl, n is 0 or a positive integer of 1 to 4, m is 0 or a positive integer of 1 to 5, p, r and s each are 0 or a positive number, and q is a positive number, satisfying the following range: $0<q/(p+q+r+s)\leq 0.5$, $0.3\leq p/(p+q+r+s)\leq 0.8$, $0\leq r/(p+q+r+s)\leq 0.35$, $0\leq s/(p+q+r+s)\leq 0.35$, provided $p+q+r+s=1$.

14. The method of claim 13 which further comprises
laminating a protective film on the dry film after the step (iv), and
stripping the protective film from the dry film;
wherein the stripping force of stripping the protective film from the dry film is 1 to 500 gf/24 mm.

* * * * *